(12) United States Patent
Srinivas et al.

(10) Patent No.: US 7,843,234 B2
(45) Date of Patent: Nov. 30, 2010

(54) BREAK-BEFORE-MAKE PREDRIVER AND LEVEL-SHIFTER

(75) Inventors: Vaishnav Srinivas, San Diego, CA (US); Vivek Mohan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 944 days.

(21) Appl. No.: 10/825,481

(22) Filed: Apr. 14, 2004

(65) Prior Publication Data

US 2005/0231260 A1 Oct. 20, 2005

(51) Int. Cl.
*H03B 1/00* (2006.01)
*H03K 3/00* (2006.01)

(52) U.S. Cl. ...................................... 327/108

(58) Field of Classification Search ......... 327/108–109, 327/112, 333; 326/63, 68, 80–83, 95–98, 326/56–57
See application file for complete search history.

(56) References Cited

U.S. PATENT DOCUMENTS

| | | | | |
|---|---|---|---|---|
| 4,450,371 A | * | 5/1984 | Bismarck | 326/17 |
| 4,532,436 A | * | 7/1985 | Bismarck | 327/208 |
| 4,978,870 A | | 12/1990 | Chen et al. | |
| 5,574,389 A | | 11/1996 | Chu et al. | |
| 6,020,762 A | * | 2/2000 | Wilford | 326/81 |
| 6,587,100 B1 | * | 7/2003 | Shirasaki | 345/204 |
| 6,717,453 B2 | * | 4/2004 | Aoki | 327/333 |
| 6,753,698 B2 | * | 6/2004 | Carpenter et al. | 326/83 |
| 6,774,695 B2 | * | 8/2004 | Hayashi et al. | 327/333 |
| 6,933,755 B2 | * | 8/2005 | Hong et al. | 327/108 |

FOREIGN PATENT DOCUMENTS

| | | |
|---|---|---|
| EP | 0714168 | 5/1996 |
| JP | 02114718 | 4/1990 |

* cited by examiner

*Primary Examiner*—Lincoln Donovan
*Assistant Examiner*—Daniel Rojas
(74) *Attorney, Agent, or Firm*—Jiayu Xu

(57) ABSTRACT

A break-before-make predriver for disabling a PFET of an output driver before enabling an NFET, and vice versa. The predriver includes an input inverter, two cross-coupled inverters, and output buffers. The predriver provides enhanced break-before-make action through sizing the NFETs larger than the PFETs in the predriver's cross-coupled inverters. The input inverter, the cross-coupled inverters and the first and second output buffers are sized with respect to each other such that substantially equal break before make action is provided on both rising and falling edges. The predriver also includes level-shifting capabilities through a different voltage supply at the PFETs of the cross-coupled inverter. The predriver also includes two data output nodes for connection to the two inputs of an output driver. The predriver provides for tristate action by disabling the signal from the predriver output nodes.

21 Claims, 7 Drawing Sheets

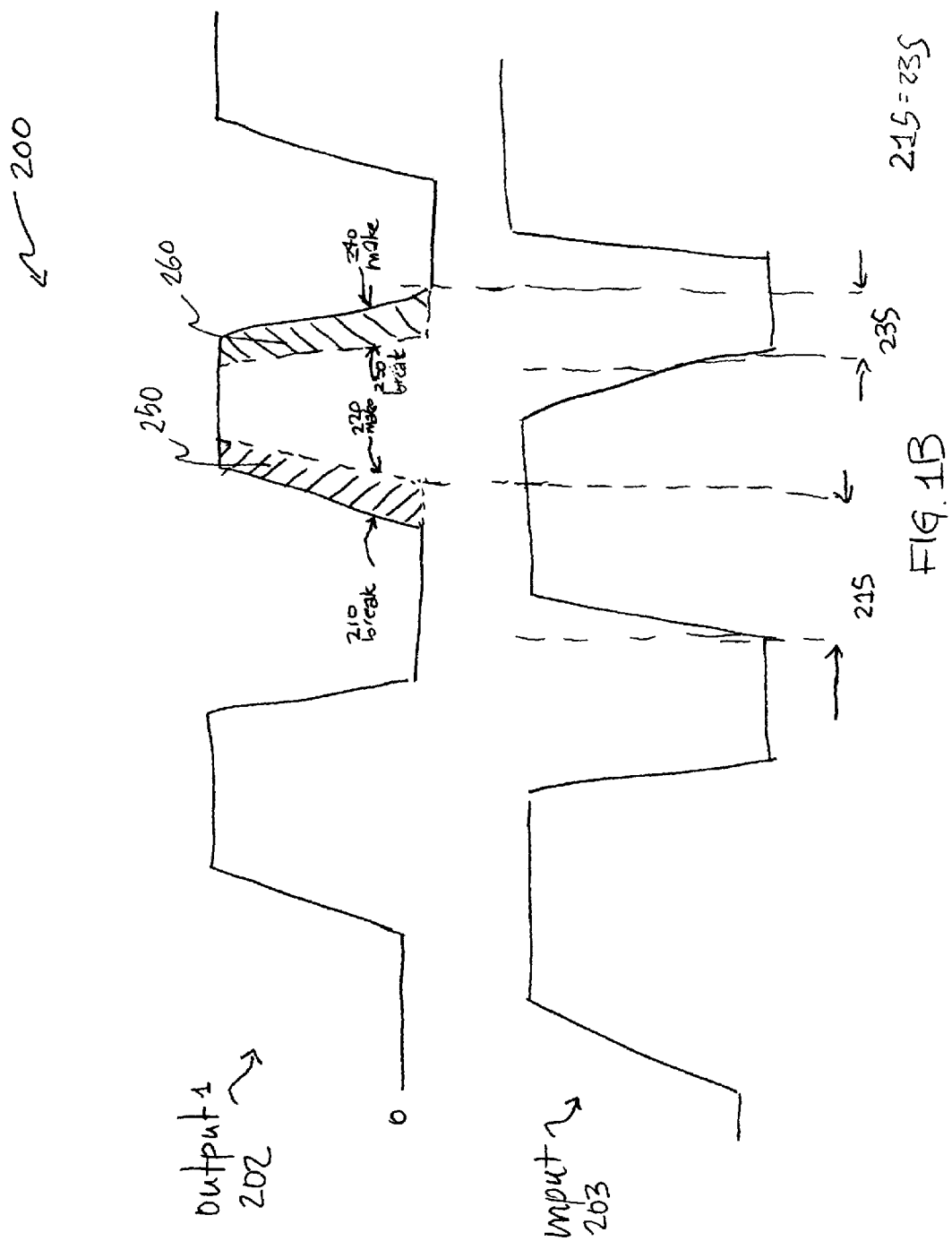

(driver ckt)

BREAK-BEFORE-MAKE PREDRIVER AND LEVEL-SHIFTER

FIELD

The present disclosure relates generally to semiconductor integrated circuits, and more particularly, to a tristate break-before-make predriver and level-shifter.

BACKGROUND

The interface between an integrated circuit and external circuitry is commonly a large complementary metal-oxide-semiconductor (CMOS) inverter. A CMOS inverter is well known in the art and generally includes a p-channel field effect transistor (PFET) and an n-channel field effect transistor (NFET) connected in series with their drains tied together and the output taken from the common drain. The two gates may be tied together and the input applied to the common gate. This circuit, known as an output driver, drives a capacitive load by rapidly switching the load. The output load may comprise a data bus and circuits attached thereto.

Various challenges are presented in the design of output drivers and related components. For example, large CMOS output drivers can consume large amounts of current during output transitions, thus leading to poor power efficiency. To increase power efficiency, some output driver designs have included a break-before-make (BBM) predriver. The BBM predriver may be used to control the gate inputs to the CMOS inverter individually so that the transistor driving the load is turned off (break) before the other transistor is turned on (make). This approach tends to reduce or eliminate crowbar current. Crowbar current is an undesirable effect which may result if both the PFET and NFET of the output driver are on.

However, even with the advantages BBM predrivers provide, challenges exist in the absence of good control over predriver output signals. For example, where significant delays exist between the make and break edges on rising and falling transitions, the efficiency of the output driver is generally decreased. Moreover, also because of issues related to the efficiency of the output driver, it is sometimes desirable that the delay between the input and make edges be equal for rising and falling transitions, resulting in a good duty cycle. It is also sometimes desirable that the delay between the break and make edges are equal for rising and falling transitions. Accordingly, flexibility in the number of buffered stages may be provided because the inverted version of a signal could be used at each predriver output, and each predriver output could be interchangeably connected to the PFET or NFET of a following output driver. Substantially equal delays between the make and break edges for rising and falling transitions may also assist in decreasing duty cycle distortion.

Voltage level-shifting may also be desirable for BBM predrivers for output drivers. Output drivers often drive an I/O device. These I/O devices may operate at higher voltages than the remainder of the chip, including the output driver driven by the BBM predriver. Accordingly, it may be desirable to increase the voltage level input to I/O device. Voltage level-shifting provides one way of increasing the voltage level input to I/O devices.

Tristate capabilities may be desirable for output drivers. Output driver circuits may include two transistors that assume in low-impedance either a high (logic "1") state, or a low (logic "0") state. In essence, these transistors are always either on, i.e., in a conductive state, or OFF, i.e., in a nonconductive state. It is often required by input-output (I/O) design specifications that the output driver be capable of disconnection from a data bus. The disconnection of the output driver for a period of time is advantageous because several I/O devices might be linked to the same output data bus.

A third state is sometimes used to disable a single output driver that is connected to a data bus having plural output drivers. Devices capable of existing in this third state may be known as "tristate" devices. The non-driving output drivers may be disabled and placed in the high impedance state such that the non-driving devices will not interfere with the output of the driving device. Because this third state may be desirable for the output driver, it would also be advantageous to have a predriver that incorporates tristate capabilities.

There is a need for a BBM predriver device that provides good control over signals, thereby decreasing duty cycle distortion.

There is further a need for a BBM predriver device that incorporates voltage level-shifting capabilities. Level-shifting would allow for more compatible operation of the predriver with I/O devices that may be driven by the output driver that is, in turn, driven by the predriver.

There is further a need for a BBM predriver device that incorporates tristate capabilities, allowing the predriver to be disabled when its corresponding I/O device is connected to the same data bus as other I/O devices.

SUMMARY

The present disclosure provides a tri-state break-before-make predriver for an output driver that incorporates level-shifting capabilities. In one aspect of the present disclosure an electronic circuit is provided. The circuit includes a driver configured to switch a current source and a current sink to a load. The circuit also includes a predriver having first and second cross-coupled inverters responsive to an input signal. The first inverter is configured to control the switching of the current source to the load and the second inverter is configured to control the switching of the current sink to the load. The cross-coupling between the first and second inverters is configured such that the first inverter removes the current source from the load before the second inverter switches the current sink to the load in response to a transition in the input signal, and the second inverter removes the current sink from the load before the first inverter switches the current source to the load in response to an opposite transition in the input signal.

In another aspect of the present disclosure, an electronic circuit is provided. The circuit includes an input inverter, two cross-coupled inverters and two output buffers. The input inverter is configured to receive an input signal. The two cross-coupled inverters include a first and second NFET and a first and second PFET. The first NFET of the cross-coupled inverter is configured to receive the output of the input inverter, and the second NFET of the cross-coupled inverter is configured to receive the input signal. The first and second output buffers are configured to receive first and second outputs of the two cross-coupled inverters. The NFETs of the cross-coupled inverters are larger than the PFETs of the cross-coupled inverters. The PFETs of the cross-coupled inverters may be substantially equal in size. The NFETs and PFETs of the cross-coupled inverter are sized with respect to each other such that a break before make delay is created between a first predriver output signal at a first predriver output node and a second predriver output signal at a second predriver output node.

Each of the input inverter, the cross-coupled inverters and the first and second output buffers is sized with respect to each other such that first and second delays between the input signal and predriver make signals on a rising and falling edge, respectively, are substantially equal. Each of the input inverter, the cross-coupled inverters and the first and second output buffers is further sized with respect to each other such that third and fourth delays between a break signal and make signal on a rising edge and on a falling edge, respectively, are substantially equal.

The circuit may include tristate capabilities in that it may incorporate tristate devices configured to disable the output signals of the first and second predriver output nodes. These tristate devices may be logic gates, such as a NAND gate and a NOR gate. These tristate devices may also be an NFET and a PFET.

In this aspect of the present disclosure, an output driver including an NFET and a PFET may be coupled to the outputs of the predriver so that a capacitive load is driven. Accordingly, the output driver is configured to receive the first and second predriver output signals. The first and second output buffers are also sized so as to be sufficiently large to drive the capacitive load.

In this aspect of the present disclosure, the circuit may also provide for level-shifting by incorporating a voltage supply coupled between the PFETs of the cross-coupled inverters.

In another aspect of the present disclosure, a break-before-make predriver apparatus is disclosed. The apparatus includes an inverter means for receiving an input signal and inverting the input signal. The apparatus also includes a cross-coupled inverter means for providing a break-before-make delay, wherein the cross-coupled inverter means is configured to receive the output of the inverter means, and the cross-coupled inverter means is further configured to receive the input signal. Finally, the apparatus includes a first and second output buffer means for receiving first and second outputs of the cross-coupled inverter means. These output buffers provide signals to predriver output nodes. The apparatus also includes first and second tristate means for disabling the output signals of the first and second predriver output nodes. The apparatus includes a voltage supply means for supplying a higher voltage at predriver output nodes than a voltage of the input signal.

In yet another aspect of a present disclosure, a method is provided for creating a break before make delay with substantially equal action on rising and falling edges. The method is practiced with a circuit having an input inverter configured to receive an input signal, two cross-coupled inverters including a pair of NFETs and a pair of PFETs, and first and second output buffers.

The method includes sizing the NFETs and PFETs of the cross-coupled inverters such that the NFETs are larger than the PFETs of the cross-coupled inverters. The method further includes sizing the input inverter, the cross-coupled inverters and the first and second output buffers with respect to each other such that first and second delays between an input signal and predriver make signals on a rising and falling edge, respectively, are substantially equal. The method still further includes sizing the input inverter, the cross-coupled inverters and the first and second output buffers with respect to each other such that an amplitude and delay between a break signal and make signal on the rising edge is substantially equal to an amplitude and time delay between a break signal and make signal on a falling edge. Finally, the method includes sizing the input inverter, cross-coupled inverters and first and second output buffers according to specifications for driving a capacitive load.

It is understood that other embodiments of the present disclosure will become readily apparent to those skilled in the art from the following detailed description, wherein it is shown and described only exemplary embodiments of the disclosure by way of illustration. As will be realized, the principles described in this disclosure may be incorporated into other and different embodiments and its several details are capable of modification in various other respects, all without departing from the spirit and scope of the present disclosure. Accordingly, the drawings and detailed description are to be regarded as illustrative in nature and not as restrictive.

BRIEF DESCRIPTION OF THE DRAWINGS

Aspects of the present disclosure are illustrated by way of example, and not by way of limitation, in the accompanying drawings wherein:

FIG. 1B is a waveform diagram of predriver output signals generated by the circuit of FIG. 1A.

FIG. 1D is an electrical path diagram of make and break output signals for a high logic input signal.

DETAILED DESCRIPTION

In the following detailed description, a predriver for driving an output driver is described. While the aspects and embodiments of the present disclosure may be well suited for use in connection with an output driver, those skilled in the art will readily appreciate that these aspects and embodiments may likewise be used in other devices, including other circuits and apparatuses. Accordingly, references in this detailed description to a predriver for an output driver are intended only to illustrate various embodiments of the present disclosure, with the understanding that the concepts described herein have a wide range of applications.

The detailed description set forth below in connection with the appended drawings is intended as a description of exemplary embodiments of the present disclosure and is not intended to represent the only embodiments in which the present disclosure can be practiced. The term "exemplary" as used throughout this description means "serving as an example, instance or illustration," and should not necessarily be construed as preferred or advantageous over other embodiments. The detailed description includes specific details for the purpose of providing a thorough understanding of the present disclosure. However, it will be apparent to those skilled in the art that the present disclosure may be practiced without these specific details. In some instances, well-known structures and devices may be shown in electronic symbol format in order to avoid obscuring the aspects and embodiments of the present disclosure.

Figure 1A:
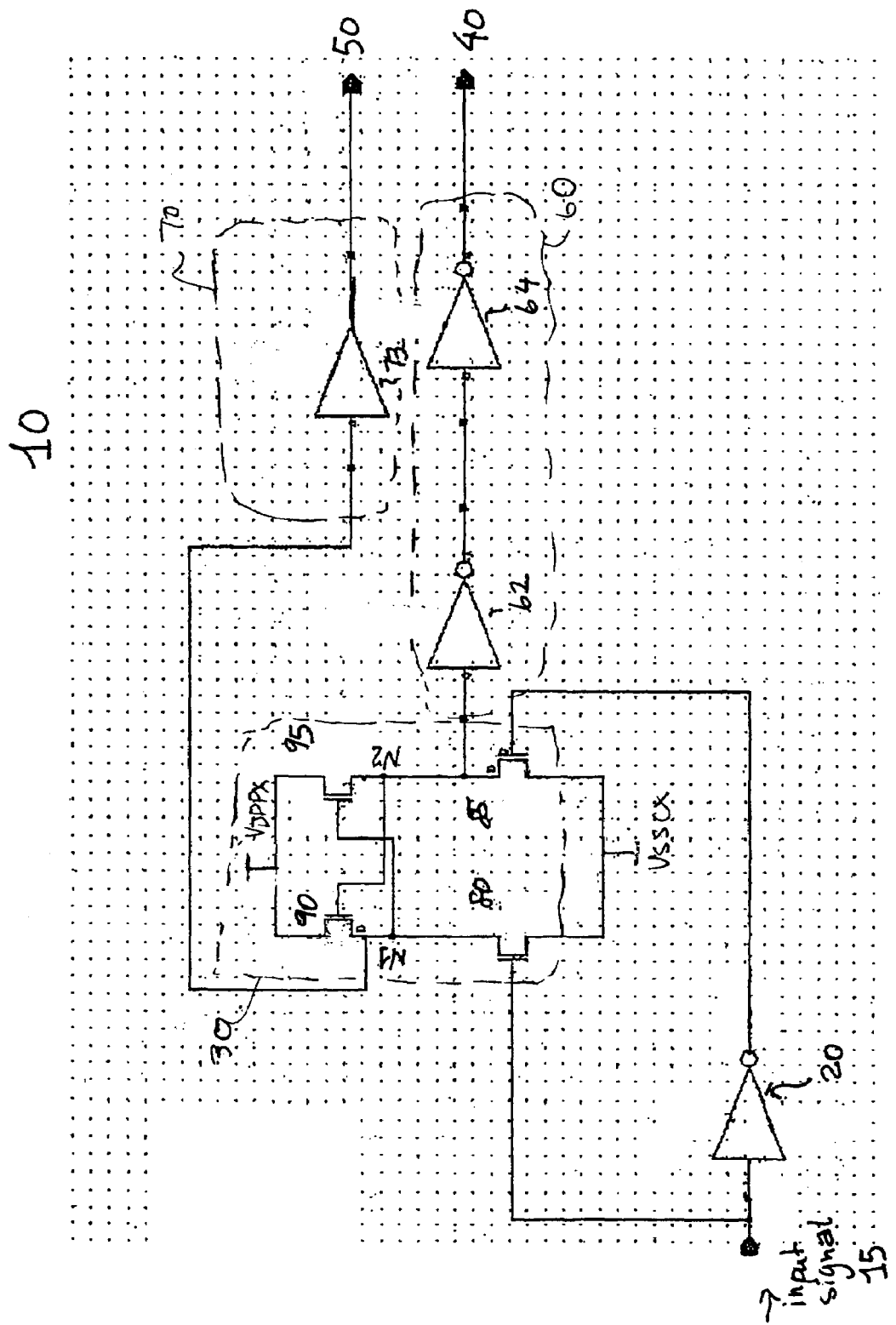
FIG. 1A is an electrical circuit diagram of a single stage predriver and level-shifter in accordance with one aspect of the present disclosure.

Referring now to FIG. 1A, illustrated is an electrical circuit diagram of a predriver and level-shifter 10 for an output driver in accordance with one aspect of the present disclosure. Included within the circuit may be an input inverter 20, two cross-coupled inverters 30 and output buffers 60, 70. Output buffers 60, 70 include inverters 62, 64, 73. Each inverter of the circuit 10 may be composed of an NFET and a PFET.

The sizes of the gates of each PFET and NFET in the circuit 10 assist in providing break-before-make action as set forth in more detail hereinbelow. The exact sizes of the gates of the PFET and NFET may depend on I/O specifications for the following output driver circuit, including the capacitive load to be driven by the output driver circuit.

The predriver accepts data input through input signal 15. The predriver output node 40 and output node 50 may be used to drive the PFET (not shown) and NFET (not shown), respectively, of a following output driver. Where the predriver circuit of FIG. 1A may be used to predrive an output driver, predriver output nodes 40, 50 may be connected to the output driver's complementary pair of PFET and NFET devices, respectively.

As is generally well-known in the art, output driver circuits may be used in digital circuits to provide a means for rapidly switching an output load (i.e., data bus) to a low (logic "0") or high (logic "1") level. When the output driver circuit is implemented in field effect transistor (FET) process technology, the output driver may be commonly formed of a PFET pull-up transistor device and an NFET pull-down transistor device connected in series between a first power supply with a positive potential VCC and a second power supply with a ground potential VSS. The connection point of the pull-up and pull-down devices may be further joined to an output node. Such output drivers are known in the art. An example of a known output driver circuit will be described in greater detail in connection with FIG. 3 hereinbelow.

Still referring to FIG. 1A, depending upon the logic state of data input signal 15, either the pull-up or pull-down transistor device of the following output driver circuit may be turned OFF and the other may be turned ON.

In operation, an input signal 15 travels two separate data paths. On a first path, the signal 15 travels through input inverter 20. On a second path, the signal 15 travels directly to NFET 80 of cross-coupled inverter 30.

As a brief overview of the outputs 40, 50 of the circuit 10, when the input signal 15 is high, or logic one, a make signal may be output at predriver output node 40. The corresponding break signal may be output at output node 50. When the input signal is logic zero, the make signal may be output at predriver output node 50, while break signal may be output at predriver output node 40. The operation of the circuit 10 and its duty cycles are set forth in greater detail hereinbelow.

In a more detailed operational description, a logic one input signal 15 will first be assumed, then a logic zero input signal 15.

Now, assuming the input signal 15 is logic one, input inverter 20 receives this high logic signal 15 on its input. The output of input inverter 20 would be logic zero, the complementary input of input signal 15. This complementary input, logic zero, may be applied to NFET 85. NFET 85 may be a n-channel field effect transistor (NFET) with a gate source and drain, as known in the art. Also known is that NFETs require a positive voltage applied to gate and drain (with respect to source) for current to flow from the drain to the source (sometimes referred to as positive drain current). Here, a logic zero signal was applied to the gate of NFET 85, and thus no positive voltage was applied to the gate. Accordingly, the NFET 85 may be OFF and the circuit is open.

On the second data path, the non-inverted logic one input signal 15 may be applied to the gate of NFET 80. This logic one signal turns NFET 800N, thereby causing current to flow from drain to source. When NFET 80 is ON, it pulls node N1 to zero. As previously disclosed, the circuit 10 includes two cross-coupled inverters 30. The first cross-coupled inverter may be comprised of NFET 80 and PFET 95. Once node N1 goes to zero, PFET 95 turns ON. This result is due to the cross-coupling of the gate of PFET 95 to NFET 80 via node N1. The second cross-coupled inverter may be comprised of NFET 85 and PFET 90, which may be coupled via node N2.

In this embodiment, nodes N1 and N2 operate at a higher voltage than the voltage of the input signal 15. However, it should be understood that the circuit 10 could operate as a BBM predriver without this higher voltage. A higher voltage may be supplied to provide level-shifting capabilities to the circuit 10. In this manner, the circuit provides both BBM action and level-shifting capabilities in a single stage. In this embodiment, a voltage supply VDDPX is applied to the sources of PFETs 90, 95. This voltage may be higher than the voltage of input signal 15, and may be delivered not only to PFETs 90, 95, but also to succeeding stages. The output buffer stages 60, 70 may also be subject to this higher voltage.

The voltage supplied to PFETs 90, 95 may be largely dependent on specifications for the I/O device ultimately driven by the output driver that is, in turn, driven by the predriver 10. I/O devices generally operate at higher voltages than the remainder of the chip. Accordingly, it may be desirable to shift the voltage level output from the predriver device and input to the I/O device. The circuit of the present disclosure provides this capability through a different voltage supplied to the PFETs and succeeding stages. This higher voltage from the later stages of the predriver 10 may be applied to the inputs of the output driver. Accordingly, the output driver can operate at the same voltage level as a corresponding I/O device.

The two cross-coupled inverters 30 have two outputs, each output providing a separate data path. A first output path leads to predriver output node 50, relaying a break signal with a logic one input signal, and a second output path leads to predriver output node 40, relaying a make signal. Prior to reaching predriver output nodes 40, 50, the cross-coupled inverter outputs may be received by output buffers 60, 70, which buffer the make and break signals prior to inputting the signals into a following output driver circuit.

Output buffers 60, 70 may be composed of one or more inverters. The inverter 62 of output buffer 60 receives the high logic signal that was output at node N2. Accordingly, the output of inverter 62 may be logic zero. This low logic may be input to inverter 64, and output at a high logic level. Output node 40 receives this high logic signal. This high logic signal may be sent to the NFET (not shown) of a following output driver circuit. As a result, the NFET of the following output driver would be turned ON.

Inverter 73 of output buffer 70 receives the low logic signal that was output at node N1 and inverts it to a high logic signal, thus providing a high logic signal to the PFET (not shown) of the following output driver circuit. As a result the PFET of the following output driver would be turned OFF. Therefore, at input signal 15 logic high, a make signal was provided to output node 40, while a break signal was provided to output node 50.

Still referring to FIG. 1A, assuming input signal 15 changed to logic zero on the input to NFET 80, the make and break signals will reverse. This low logic signal would turn NFET 80 OFF. On the alternate data path to input inverter 20, the low logic zero signal as input would result in a high logic one signal on the output. This high logic signal may be input to NFET 85, turning NFET 850N.

Because PFET 95 was in its conductive state, N2 may be at high logic level one. The change of input signal 15 to logic zero does not immediately affect node N1 due to a delay between the discharging of node N2 and the charging of node N1. This delay can be increased or decreased by changing the sizes of NFETs 80, 85 and PFETs 90, 95. Because node N2 may be affected by both PFET 95 and NFET 85, NFET 85 should be larger than the size of PFET 95 to pull node N2 to zero. NFET 80 should also be larger than PFET 90 to pull node N1 to zero. The sizes of the inverters 20, 62, 64, 73 also assist in providing substantially equal duty cycles in BBM action as set forth in greater detail hereinbelow. Even before NFET 85 pulls node N2 to zero, it begins to turn PFET 900N when the voltage at N2 falls below the gate threshold voltage. Once PFET 90 is ON, node N1 may begin to pull up to logic one and turn PFET 90 OFF.

The inverter 62 of output buffer 60 receives the low logic signal that was output at node N2. Accordingly, the output of inverter 62 may be logic one. This high logic may be input to inverter 64, and output at a low logic level. Output node 40 receives this low logic signal. This low logic signal may be sent to the NFET (not shown) of a following output driver circuit. As a result, the NFET of the following output driver would be turned off.

Inverter 73 of output buffer 70 receives the high logic signal that was output at node N1 and inverts it to a low logic signal. This low logic signal is applied to the PFET (not shown) of a following output driver, turning the PFET on, thus providing a make signal. Therefore, at input signal 15 logic low, a break signal may be provided to output node 40, while a make signal may be provided to output node 50. It should also be noted that the present disclosure provides flexibility in the number of output buffer stages that can be incorporated into the predriver. Additional buffered stages could be used after output buffers 60, 70 and before outputs 40, 50. Where appropriate, the inverted versions of outputs 40, 50 could be used, and the PFET (not shown) of the following output driver could be interchangeably connected to output node 40, while the NFET (not shown) of the following output driver could be connected to output node 50. In order to compensate for the inversion, another inverter could be added in the signal path, e.g., before or at the initial input of the predriver 10.

Referring now to FIG. 1B, shown is a waveform diagram 200 of predriver outputs 202 as a function of time. Also illustrated are predriver inputs 203 as a function of time. The outputs 202 roughly follow the inputs 203. This waveform 202 may be output by the BBM predriver and level-shifter of FIG. 1A, and more particularly, the signals may be output at the predriver output nodes 40, 50.

The predriver disclosed herein may be known as a BBM predriver because the break signals are designed to precede the make signals on the rising and falling edges of the input signals 203. As illustrated, on a rising edge, break signal 210 may be output at a first predriver output node (FIG. 1A, 50) when an input signal at 203 is logic one. Make signal 220 may be output at a second predriver output node (FIG. 1A, 40) when the input signal at 203 is logic one. The delay between the input signal and make signal 220 may be illustrated by the gap at 215. Likewise, on a falling edge, as the input signal drops to low logic zero, the make signal 230 may be output at a first predriver node (FIG. 1A, 50), while the break signal 240 may be output at a second output node (FIG. 1A, 40). The delay between input and make signal 240 may be illustrated by the gap at 235.

The make signals 220, 240 create the duty cycles that may be output to a following output driver. When a make signal is sent to the PFET, the following output driver may provide a current sink for the load. When a make signal is sent to the NFET, the following output driver may provide a current source to the load. The outputs at each output node of the predriver should each have substantially equal duty cycles.

The substantially equal delays 215, 235 between input and the make signals 220, 240 maintain a good duty cycle for the predriver. This substantially equal delay may be created by proper sizing of the inverters of the circuit. The amplitude and time delay of BBM action may also be substantially equal as illustrated by cross-hatching at 250, 260. In other words, break before make action on the rising edge at 250 should be substantially equal to break before make action on the falling edge at 260.

Figure 1C:
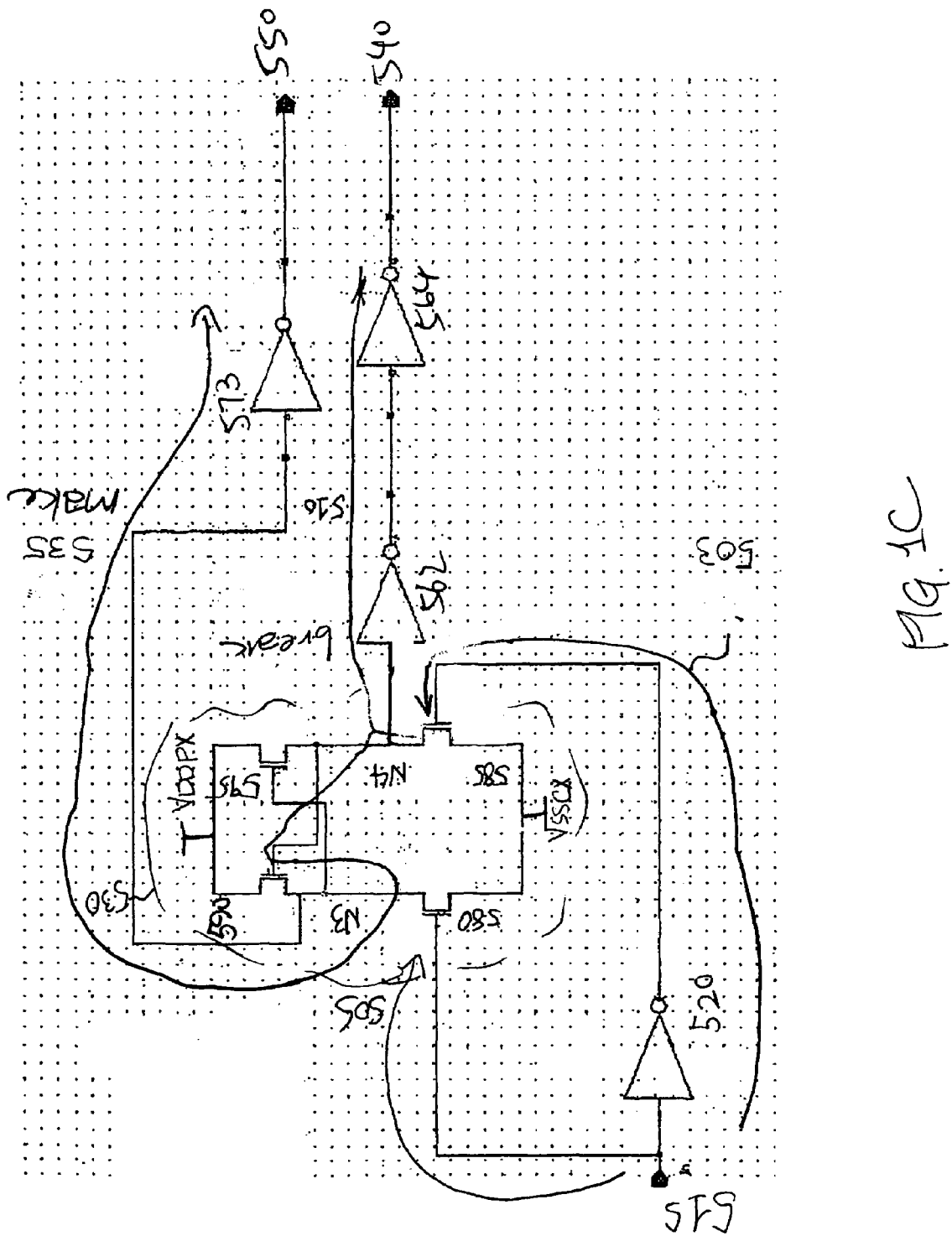
FIG. 1C is an electrical path diagram of make and break output signals for a low logic input signal.
Figure 10:
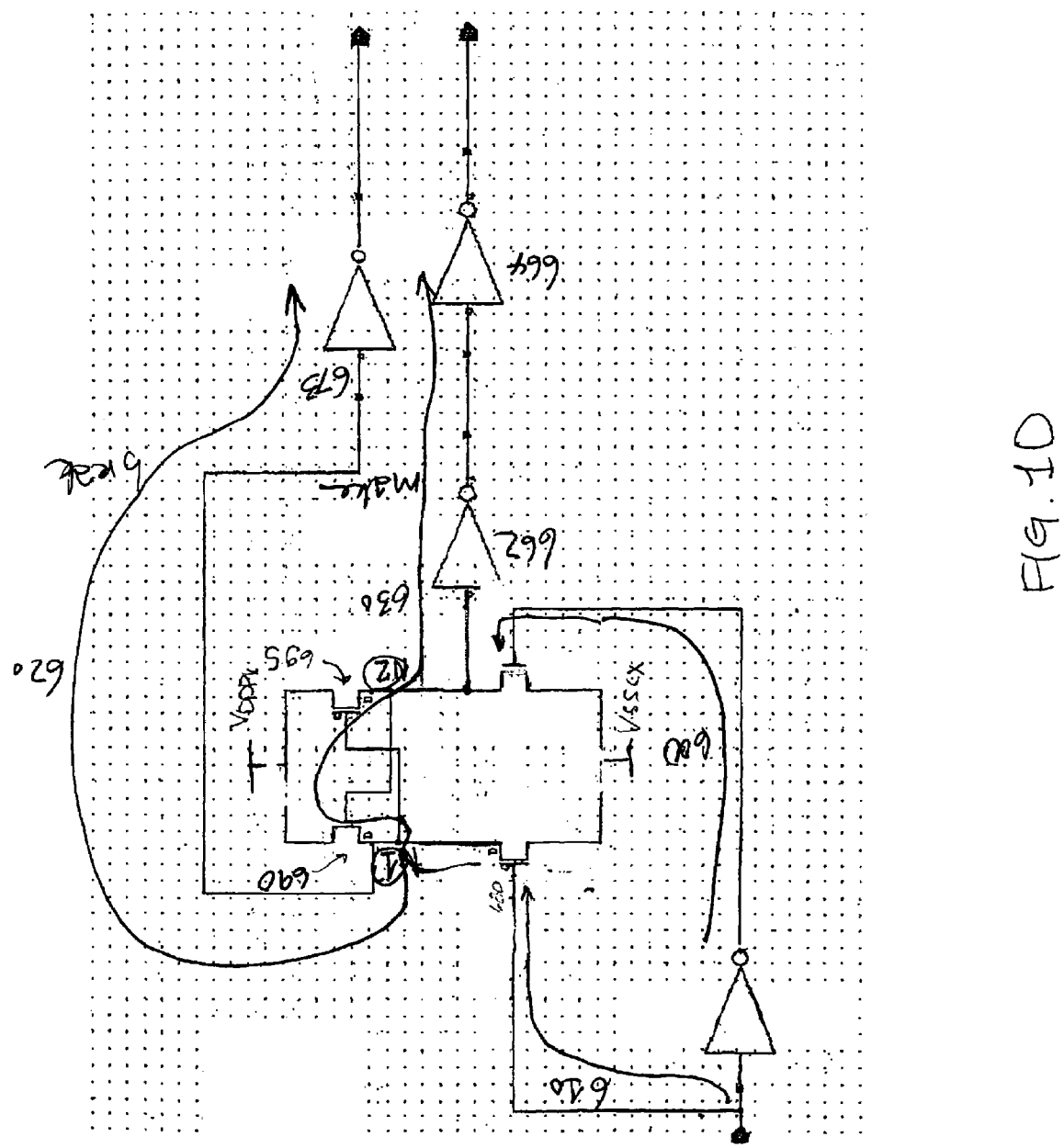

Referring now to FIG. 1C, the sizes of the PFETs and NFETs of the predriver may depend not only on the voltage specifications for related drivers and I/O devices, but may also depend on the capacitive load driven by the following output driver circuit. Illustrated in FIG. 1C is a diagram of break path 510 and make path 535. Once capacitive loads are known at outputs 540, 550, the sizing of NFETs 580, 585, PFETs 590, 595 and inverters 520, 562, 564, 573 can be determined. The load ultimately driven by the output signal at predriver output node 550 may be typically twice the load ultimately driven by the signal at 540. The delay created by the sizes of inverters 520, 562, 564, 573 as well as elements of the cross-coupled inverter 530 can be modeled by an RC circuit. The resistance (R) is equal to the resistance of the transistor in the "ON" state, and the capacitance (C) is equal to the capacitive loading at the output. The delay is proportional to the RC time constant, $\tau=RC$. Larger R means longer delay, while a larger C also means a longer delay.

In the embodiment illustrated, input inverter 20 includes a PFET having a width-to-length (W/L) ratio of 0.8/0.13 and an NFET having a W/L ratio of 0.4/0.13. Inverter 62 of output buffer 60 includes a PFET having a W/L ratio of 3/0.3 and an NFET having a W/L ratio of 1/0.3. Inverter 64 of output buffer 60 includes a PFET having a W/L ratio of 12/0.3 and an NFET having a W/L ratio of 4/0.3. Inverter 73 of output buffer 70 includes a PFET having a W/L ratio of 3/0.3 and an NFET having a W/L ratio of 1/0.3.

Within cross-coupled inverters 30, NFET 80 has a W/L ratio of 3/0.3, while NFET 85 has a W/L ratio of 5/0.3. PFET 90 has a W/L ratio of 1.4/0.3, and PFET 95 has a W/L ratio of 1.4/0.3. The sizes above are given in micro-meters and refer to the W/L ratio of the gates of the corresponding PFETs and NFETs.

In this sizing example, the PFETs 590, 595 are of the same size, thus creating substantially equal delays between input signals and make signals, while also creating substantially equal break before make action. However, it should be understood that the sizes of PFETs 590, 595 could be changed relative to the sizes of input inverter 520, the two cross-coupled inverters 530 and inverters 562, 564, 573.

This diagram illustrates the data paths when NFET 580 is OFF. When NFET 580 is OFF, the input data signal 515 may be provided to paths 503, 505. Because NFET 580 is OFF, it may be nonconductive and may not provide an output path for the input signal 515 beyond path 505. However, because NFET 585 is ON, signals may be provided to output paths 510, 535. For path 510, the break signal may be provided to output 540. For path 535, the make signal may be provided to output 550. A BBM delay occurs between nodes N3 and N4 due to the cross-coupled inverters 530.

A signal at each of outputs 540, 550 may be used to drive a following output driver. If a single predriver output signal was used to drive the output, issues with "crowbar current" might occur. A crowbar current may be a short circuit current caused by both the pull-up driver of the output driver and the pull-down driver of the output driver being on concurrently. This occurs because when the predrivers are advantageously sized to turn on the pull-up or pull-down drivers as fast as possible, the may be a period of time when the opposing driver is still on due to predriver's inability to switch the opposing driver into the off state. The resulting crowbar current may be effectively analogous to a short circuit from power to ground through the concurrently "on" output transistors. Some detrimental effects of such a crowbar current decreased power efficiency, including for the reason that power consumption may be increased for active devices. BBM delays may assist in reducing or eliminating crowbar current.

In this example, because of the state of the input signal and resulting ON transistors, the BBM delay may be attributed to the ON PFET 590 of cross-coupled inverters 530. Here, the size of PFET 590 determines the delay created between nodes N3 and N4. PFET 590 should be sized so that the propagation delay of the signal on path 535 from node N3 to output node 550 may be about the same as the propagation delay from node N4 to output node 540 on path 510. As the size of PFET 590 is reduced, the delay along path 535 may be increased to output 550. Because one signal travels along path 535 through inverter 573 to output 550, inverter 573 should be made sufficiently large to drive the load at output 550. A second signal provides path 510, which travels through inverters 562, 564 to output 540. Accordingly, inverters 562, 564 should be sufficiently large to drive the load at output 540.

Referring now to FIG. 1D, illustrated is a diagram of make paths 610, 630 and break paths 600, 620 when NFET 680 is ON. When node N1 falls to zero, it triggers break path 620. In many cases, it is desirable that delay occur between the rising and falling edges of the predriver output signals. Therefore, a delay could be attributed to PFET 690 and inverter 673 which is the same as the delay between inverters 662, 664. The sizes of inverters 662, 664, 673 could create this delay. Different sizes would exist in this case between PFET 690 and 695.

Another way to create substantially the same delay between rising and falling edges of the output signal is to size principally the inverters 620, 662, 664, 673.

Figure 2:
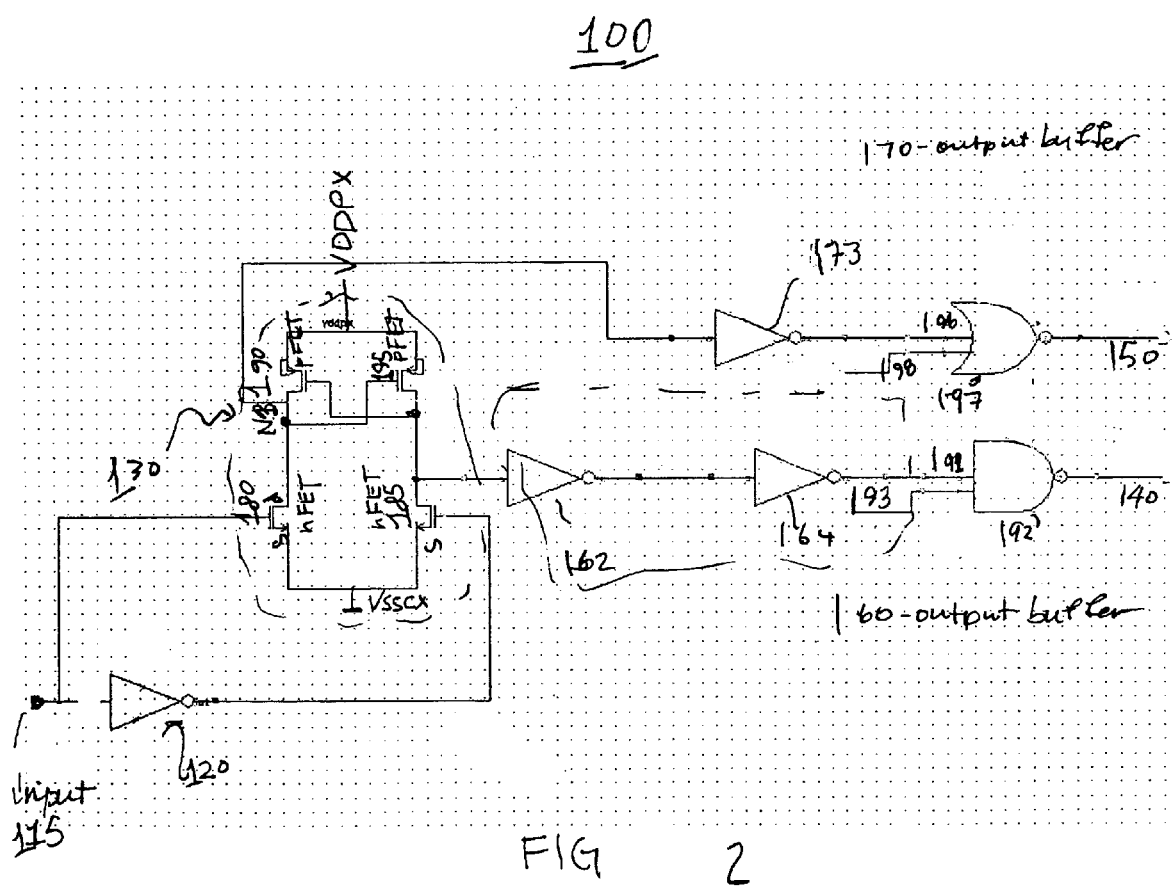
FIG. 2 is an electrical circuit diagram of a tristate predriver and level-shifter in accordance with one aspect of the present disclosure.

Referring now to FIG. 2, illustrated is another embodiment of a BBM predriver and level-shifter 100. This embodiment incorporates all the features of FIG. 1A, but also includes tristate capabilities. These elements are an input signal 115, an input inverter 120, two cross-coupled inverters 130 and output buffers 160, 170. The two cross-coupled inverters include NFETs 180, 190 and PFETs 185, 195. Output buffers 160, 170 include inverters 162, 164, 173. Tristate capabilities may be essentially provided by NAND gate 192 and NOR gate 197. In this embodiment, output node 140 receives the output of NAND gate 192. This NAND gate output would then be coupled to the PFET of a following output driver. Output node 150 receives the output of NOR gate 197, which is coupled to the NFET of the following output driver.

Tristate capabilities may be provided to the circuit 100 via enable signals at the inputs 193, 198 to NAND gate 192, and NOR gate 197, respectively. These enable signals would be used to force the outputs of the gates 192, 197 to a state such that both transistors of a following output driver may be turned OFF, despite input 191 to NAND gate 192 and input 196 to NOR gate 197. Accordingly, both drive signals to a PFET (not shown) and NFET (not shown) of a following output driver circuit could be disabled and these output nodes 140, 150 would remain in a high impedance state.

Figure 3:
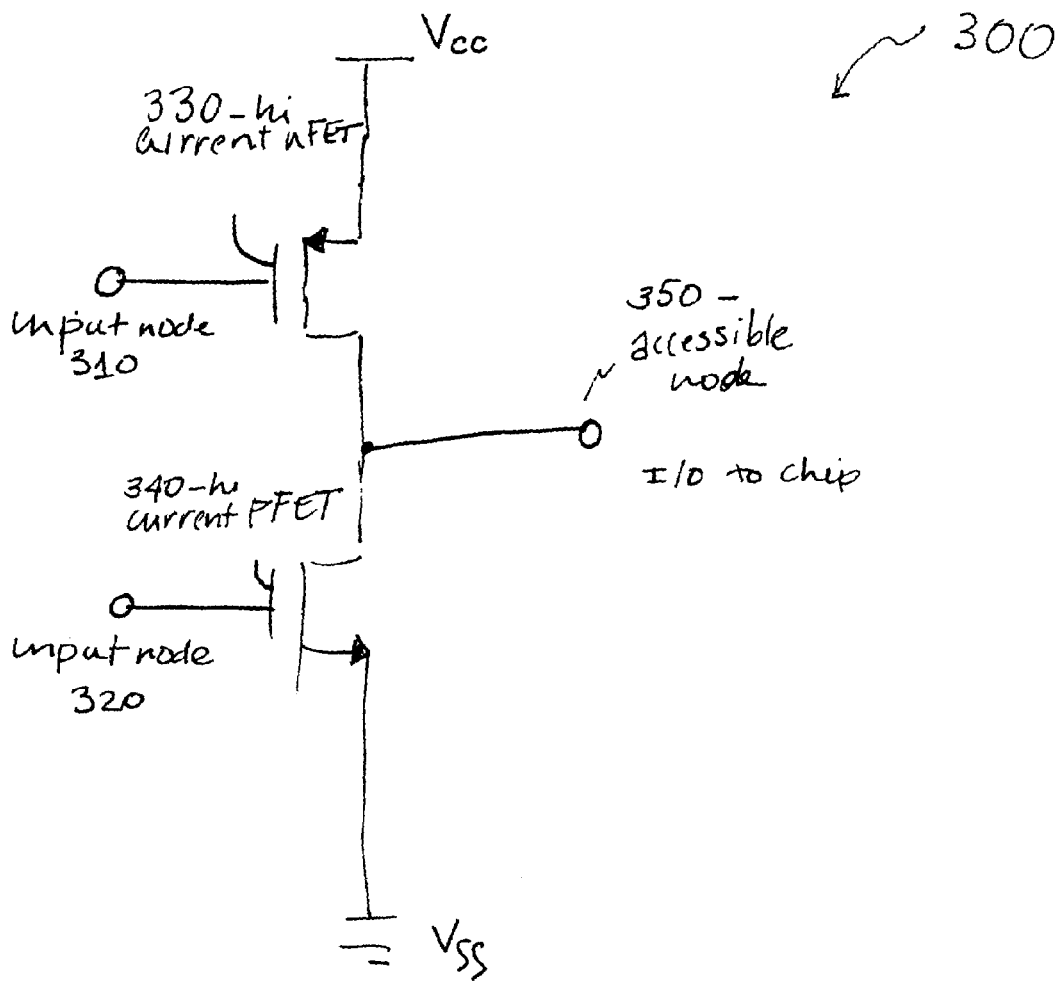
FIG. 3 is an electrical circuit diagram of a CMOS output driver circuit that may be driven by the predriver and level-shifter of FIG. 2.

Referring now to FIG. 3, illustrated is an electrical circuit diagram of a CMOS driver circuit 300, which may be used with the predriver and level-shifter of FIG. 2. If used with the circuit of FIG. 2, input 310 may be connected to the first predriver output node and input 320 to the second predriver output node. A PFET 340 and complementary NFET drive accessible node 350. When a make signal is received at input node 320, the output driver 300 discharges the capacitive load via accessible node 350. When a make signal is received at input node 310, the output driver 300 charges the capacitive load via accessible node 350.

Driver circuit 300 may be located on the same semiconductor chip and in close proximity to any of the predriver embodiments disclosed herein. Accessible node 350 may be an I/O connection to the chip, such as a wired bonded connection or a connection pad. Although a single output driver circuit is shown in FIG. 3, it should be understood that an I/O device such as an output driver might be connected to a data bus that includes a number of separate output drivers.

Figure 4:
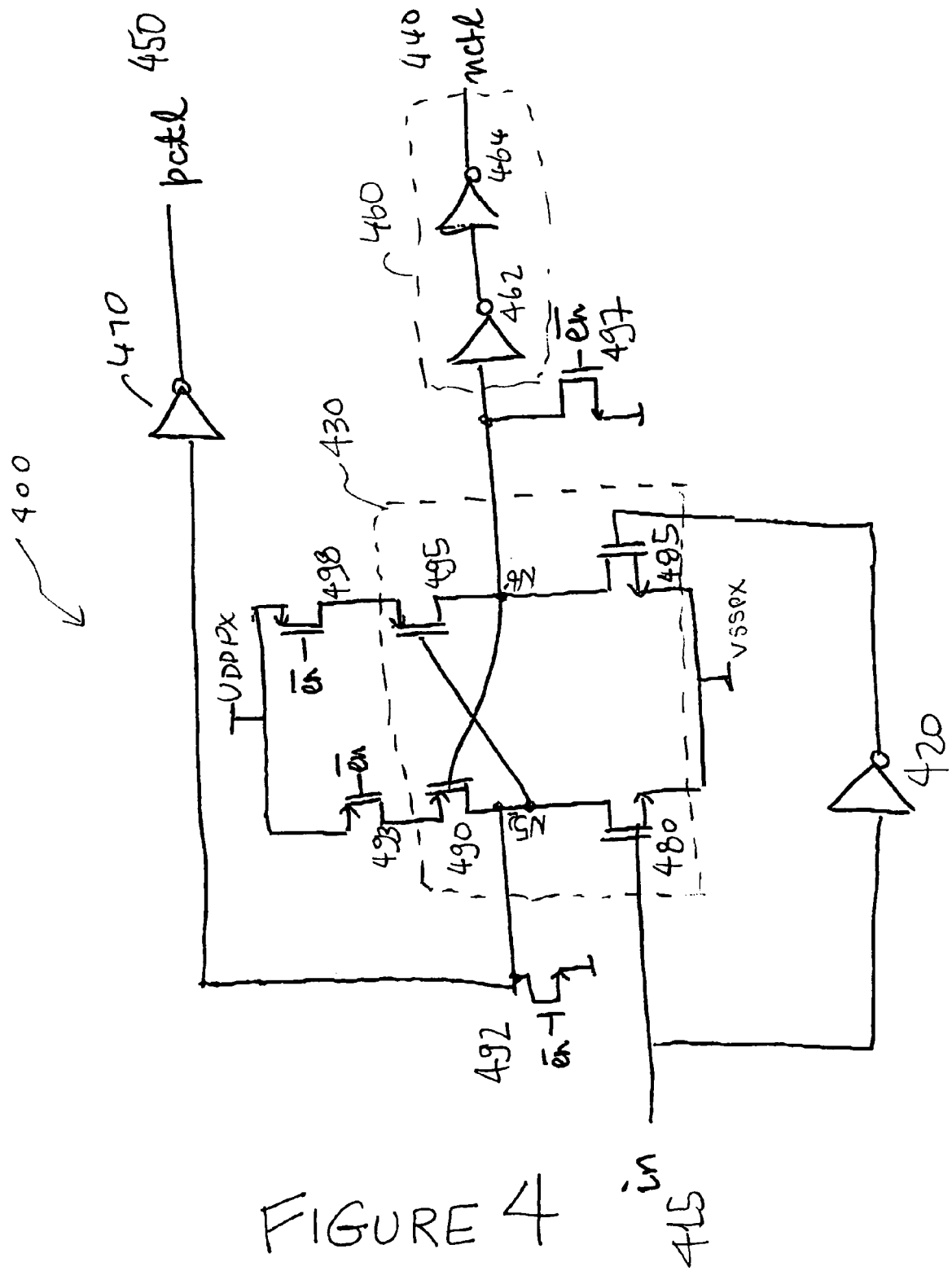
FIG. 4 is an electrical circuit diagram of a tristate predriver and level-shifter in accordance with yet another aspect of the present disclosure.

Referring now to FIG. 4, illustrated is yet another embodiment of a BBM predriver and level-shifter 400 with tristate capabilities. In this embodiment, NFETs 493, 498 and PFETs 492, 497 may be used to provide tristate capabilities in lieu of the NAND gate/NOR gate embodiment of FIG. 2. During regular operation (en=1), NFETs 492, 492 are inactive, while PFETs 493, 498 are active. The tristate predriver and level-shifter 400 includes an input inverter 420, cross-coupled inverters 430, and output buffers 460, 470.

In operation, on a first path, an input signal 415 is directed through input inverter 420, while the second path is directed to NFET 480 of cross-coupled inverter 430. Like the preceding embodiments, the path through which the make and break signals are provided depend on the input signal 415 to the predriver and level-shifter. When the input signal 415 is high logic one, a break signal is output at predriver output node 450, and a make signal is output at predriver output node 440. When the input signal is logic zero, a make signal is output at predriver output node 440, and a break signal is output at predriver output node 450.

In operation, the circuit 400 operates similarly to the circuits of FIGS. 1A and 2. Now, assuming the input signal 415 is logic one, input inverter 420 receives this high logic signal 415 on its input. The output of input inverter 420 would be logic zero, the complementary input of input signal 415. This complementary input, logic zero, may be applied to NFET 485. Accordingly, the NFET 485 may be OFF and the circuit is open.

On the second data path, the non-inverted logic one input signal 415 may be applied to the gate of NFET 480. This logic one signal turns NFET 480 ON, thereby causing current to flow from drain to source. When NFET 480 is ON, it pulls node N5 to zero. Since NFET 492 is inactive (en=1), the inverter 470 which comprises the output buffer to node 450, receives the low logic signal that was output at node N5, and inverts it to a high logic signal. The high logic output at node 450 would lead to the PFET of a following output driver, turning this PFET off.

As with preceding embodiments, the circuit 400 includes two cross-coupled inverters 430. The first cross-coupled inverter may be comprised of NFET 480 and PFET 495. Once node N5 goes to zero, PFET 495 turns ON. This result is due to the to the cross-coupling of the gate of PFET 495 to NFET 480 via node N5. The second cross-coupled inverter may be comprised of NFET 485 and PFET 490, which may be coupled via node N6.

The two cross-coupled inverters 430 together have two outputs, each output providing a separate data path. Prior to reaching the predriver output nodes 440, 450, the cross-coupled inverter outputs may be received by output buffers 460, 470, which buffer the make and break signals prior to inputting these signals into a following output driver circuit.

NFET 485 is OFF, resulting in a high logic signal to node N6. This output may be applied to inverter 462 because NFET 497 is inactive during regular operation. Inverter 462 therefore outputs a low logic signal which is applied to inverter 464. Inverter 464 then outputs a high logic signal. This high logic signal is applied to output node 440. Thereafter, the high logic signal is applied to the NFET (not shown) of a following output driver circuit. As a result, the NFET of the following output driver would be turned on.

Therefore, at input signal 415 logic high, a make signal was provided to output node 440, while a break signal was provided to output node 550.

Still referring to FIG. 4, assuming input signal 415 changed to logic zero on the input to NFET 480, the make and break signals will reverse. This low logic signal would turn NFET 480 OFF. On the alternate data path to input inverter 420, the low logic zero signal as input would result in a high logic one signal on the output. This high logic signal may be input to NFET 485, turning NFET 485ON.

Because PFET 495 was in its conductive state, N6 may initially be at high logic level one. The change of input signal 415 to logic zero does not immediately affect node N5 due to a delay between the discharging of node N6 and the charging of node N5. This delay can be increased or decreased by changing the sizes of NFETs 480, 485 and PFETs 490, 495. Because node N6 may be affected by both PFET 495 and NFET 485, NFET 485 should be larger than the size of PFET 495 to pull node N6 to zero. NFET 480 should also be larger than PFET 490 to pull node N5 to zero. The sizes of the inverters 420, 462, 464, 470 also assist in providing substantially equal duty cycles in BBM action. Even before NFET 485 pulls node N6 to zero, it begins to turn PFET 490ON when the voltage at N6 falls below the gate threshold voltage. Once PFET 490 is ON, node N5 may begin to pull up to logic one and turn PFET 490 OFF.

The inverter 462 of output buffer 460 receives the low logic signal that was output at node N6. Accordingly, the output of inverter 462 may be logic one. This high logic may be input to inverter 464, and output at a low logic level. Output node 450 receives this low logic signal. This low logic signal may be sent to the PFET (not shown) of a following output driver circuit. As a result, the PFET of the following output driver would be turned ON.

Inverter 470 receives the high logic signal that was output at node N5 and inverts it to a low logic signal. Therefore, at input signal 415 logic low, a make signal may be provided to output node 450, while a break signal may be provided to output node 440:

In tristate operation, enable signals are applied to the gates of PFETs 493, 498 and NFETs 492, 497. When an enable signal of logic one is applied to NFET 492, the output to inverter 470 would always be zero, resulting in an output of one to node 450, disabling the PFET of the following output driver. When an enable signal is provided to NFET 497, it would output a high logic one to inverter 462. The output of inverter 462 would be a low logic one. Because inverter 464 receives this output, inverter 464 would output logic zero to node 440. This output would disable the NFET of a following output driver.

Moreover, because PFETs 493, 498 would be disabled, assuming a high logic signal were applied to their gates, voltage supply VDDPX would not be applied to outputs 440, 450. Accordingly, both drive signals to a PFET (not shown) and NFET (not shown) of a following output driver circuit could be placed in a high impedance state.

The previous description of the disclosed embodiments is provided to enable one skilled in the art to make or use the present disclosure. Various modifications to these embodiments will be readily apparent to those skilled in the art. The principles set forth herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A driver circuit, comprising:
   a driver configured to switch a current source and a current sink to a load via a single node; and
   a predriver having first and second cross-coupled inverters that include a first and second NFET and a first and second PFET responsive to an input signal, the first inverter being configured to control the switching of the current source to the load and the second inverter being configured to control the switching of the current sink to the load; wherein:
   the first NFET is larger than the second PFET, creating unequal delays between the output of the first inverter falling to logic zero and the output of the second inverter rising to logic one;
   the second NFET is larger than the first PFET, creating unequal delays between the output of the second inverter falling to logic zero and the output of the first inverter rising to logic one;
   the cross-coupling between the first and second inverters and buffer connections of the first and second inverters to said driver are configured such that:
     the first inverter controls the driver to remove the current source from the load via said single node before the second inverter controls the driver to switch the current sink to the load via said single node in response to a transition in the input signal such that a crow-bar current is controlled, and conversely
     the second inverter controls the driver to remove the current sink from the load via said single node before the first inverter controls the driver to switch the current source to the load via said single node in response to an opposite transition in the input signal such that said crow-bar current is controlled, and wherein:
   the first and second inverters are further configured to remove both the current source and the current sink from the load concurrently to allow tristate operation of the driver.

2. The driver circuit of claim 1 wherein for each of the inverters, the p-channel FET (PFET) having a drain and the n-channel FET (NFET) having a drain connected to the drain of the PFET.

3. The driver circuit of claim 2 wherein for each of the inverters, the NFET comprises a gate responsive to the input signal, and the PFET comprises a gate coupled to the drain of the PFET in the other inverter.

4. The driver circuit of claim 3 wherein the NFET in the first inverter is substantially the same size as the NFET in the second inverter, and wherein the PFET in the first inverter is substantially the same size as the PFET in the second inverter.

5. The driver circuit of claim 1 further comprising a voltage source coupled to the inverters, the voltage source providing level shifting at an output of each inverter in response to the input signal.

6. A driver circuit, comprising:
   an input inverter configured to receive an input signal;
   two cross-coupled inverters that include a first and second NFET and a first and second PFET, wherein the first NFET is configured to receive the output of the input inverter, and wherein the second NFET is configured to receive the input signal;

first and second output buffers configured to receive first and second outputs of the two cross-coupled inverters, wherein said first buffer inverts said first output and said second buffer leaves said second output uninverted;

wherein the NFETs of the cross-coupled inverters are larger than the PFETs of the cross-coupled inverters, said NFETs and PFETs being sized with respect to each other such that:

each of the first and second outputs of the two cross-coupled inverters falls to logic zero before the other of the first and second outputs rises to logic one in response to a transition in the input signal so that:

a first break before make delay is created between a first predriver output signal at a first predriver output node and a second predriver output signal at a second predriver output node; and a second break before make delay is created between the second predriver output signal at the second predriver output node and the first predriver output signal at the first predriver output node; and first and second tristate devices configured to disable output signals of the first and second predriver output nodes.

7. The driver circuit of claim 6, wherein each of the input inverter, the cross-coupled inverters and the first and second output buffers are sized with respect to each other such that first and second delays between the input signal and predriver make signals on a rising and falling edge, respectively, are substantially equal; and wherein each of the input inverter, the cross-coupled inverters and the first and second output buffers are further sized with respect to each other such that third and fourth delays between a break signal and make signal on a rising edge and on a falling edge, respectively, are substantially equal.

8. The driver circuit of claim 6, wherein the PFETs of the cross-coupled inverters are substantially equal in size.

9. The driver circuit of claim 6, wherein each tristate device is a logic gate, and wherein each logic gate includes a first input configured to receive a predriver output signal, each logic gate being further configured to receive a disable signal.

10. The driver circuit of claim 9, wherein the first tristate device is a NAND gate and the second tristate device is a NOR gate.

11. The driver circuit of claim 6, wherein the first tristate device is an NFET and the second tristate device is a PFET.

12. The driver circuit of claim 6, further comprising: an output driver device configured to receive the first and second predriver output signals, the output driver device being further configured to drive a capacitive load.

13. The driver circuit of claim 12, wherein each of the input inverter, the cross-coupled inverters and the first and second output buffers are further sized so as to be sufficiently large to drive the capacitive load.

14. The driver circuit of claim 12, wherein the output driver device includes an NFET device and a PFET device.

15. The driver circuit of claim 6, wherein the input signal has an input voltage, and the predriver further comprises:

a voltage supply configured to supply, at said predriver output nodes, a higher voltage than said input voltage.

16. The driver circuit of claim 15, wherein the voltage supply is coupled between the first and second PFETs of the cross-coupled inverter.

17. The driver circuit of claim 6, wherein the output buffers include one or more inverters.

18. A break-before-make predriver, comprising:

inverter means for receiving an input signal and inverting said input signal;

cross-coupled inverter means for providing a break-before-make delay, wherein the cross-coupled inverter means is configured to receive the output of the inverter means, the cross-coupled inverter means is further configured to receive the input signal, the cross-coupled inverter means includes first and second outputs, the first output has a first delay charging relative to the second output discharging, the second output has a second delay charging relative to the first output discharging, and said first and second delays are created by the unequal transistor sizes of the cross-coupled inverters;

first and second output buffer means for receiving the first and second outputs of the cross-coupled inverter means, for inverting the first output of the cross-coupled inverter means while leaving the second output of the cross-coupled inverter means uninverted so that the first output buffer means provides a break transition before the second output buffer means provides a make transition due to the second delay, and the second output buffer means provides a break transition before the first output buffer means provides a make transition due to the first delay; and first and second tristate means for disabling output signals of the first and second predriver output nodes.

19. The predriver of claim 18, further comprising:

voltage supply means for supplying a higher voltage at predriver output nodes than a voltage of the input signal.

20. In a circuit having an input inverter configured to receive an input signal, two cross-coupled inverters including a pair of NFETs and a pair of PFETs, and first and second output buffers, a sizing method for creating a break before make delay with substantially equal action on rising and falling edges, the method comprising:

sizing the NFETs and PFETs of the cross-coupled inverters such that each of the NFETs are larger than each of the PFETs of the cross-coupled inverters so that a first time constant to charge a first output of the cross-coupled inverters is greater than a second time constant to discharge a second output so that the second output discharges before the first output charges; and so that a third time constant to charge the second output of the cross-coupled inverters is greater than a fourth time constant to discharge the first output so that the first output discharges before the second output charges;

sizing the input inverter, the cross-coupled inverters and the first and second output buffers with respect to each other such that first and second delays between an input signal and predriver make signals on a rising and falling edge, respectively, are substantially equal;

sizing the input inverter, the cross-coupled inverters and the first and second output buffers with respect to each other such that a third and fourth delays between a break signal and make signal on a rising edge and falling edge, respectively, are substantially equal;

configuring the first and second output buffers such that the break signal on the rising edge occurs before the make signal on the rising edge, and the break signal on the falling edge occurs before the make signal on the falling edge; and configuring the cross-coupled inverters to remove both the current source and the current sink from the load concurrently to allow tristate operation of the circuit.

21. The method as recited in claim 20, further comprising:

sizing the input inverter, cross-coupled inverters and first and second output buffers according to specifications for driving a capacitive load.

* * * * *